United States Patent
Eng et al.

(10) Patent No.: US 6,248,651 B1
(45) Date of Patent: *Jun. 19, 2001

(54) LOW COST METHOD OF FABRICATING TRANSIENT VOLTAGE SUPPRESSOR SEMICONDUCTOR DEVICES OR THE LIKE

(75) Inventors: Jack Eng, Bellmore; Joseph Chan, Kings Park; Gregory Zakaluk, N. Seaford; John Amato, Northport; Dennis Garbis, South Huntington, all of NY (US)

(73) Assignee: General Semiconductor, Inc., Melville, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/103,731

(22) Filed: Jun. 24, 1998

(51) Int. Cl.$^7$ .................... H01L 21/225; H01L 21/302
(52) U.S. Cl. ............................ 438/558; 438/697
(58) Field of Search .................... 438/133, 134, 438/690, 691, 745, 749, 750, 753, 558, 565, 568, 906, 928, 963, 974, 977, 697, FOR 157, FOR 287

(56) References Cited

U.S. PATENT DOCUMENTS

| | | |
|---|---|---|
| 3,436,259 | 4/1969 | Regh et al. |
| 4,711,256 | 12/1987 | Kaiser . |
| 4,935,386 * | 6/1990 | Nakagawa et al. .................. 438/558 |
| 5,104,828 | 4/1992 | Morimoto et al. |
| 5,137,597 | 8/1992 | Curry, II et al. |
| 5,190,064 | 3/1993 | Aigo . |
| 5,201,958 | 4/1993 | Breunsbach et al. |
| 5,223,080 | 6/1993 | Ohta et al. |
| 5,227,339 | 7/1993 | Kishii . |
| 5,240,883 | 8/1993 | Abe et al. |
| 5,360,509 | 11/1994 | Zakaluk et al. |

OTHER PUBLICATIONS

Japanese Abstracts JP 61166133 and JP 59035421 Silicon Processing for the VLSI Era. pp. 23–25 Lattice Press 1986.
VLSI Technology, pp. 34–39 McGraw, Hill (1983).

Integrated Circuits, p. 274, Motorola, 1965.

Semiconductor Silicon Crystal Technology, 1987, Academic Press, 1989.

A Future Technology for Silicon Wafer Processing for USLI, pp. 251–255 (1991).

Backgrinding Wafters For Maximum Die Strength Sharon Lewis, Micron Technology Inc., Jul. 1992 pp–86–89.

Internal gettering heat treatments and oxygen precipitation in Epitaxial silicon wafers—W. Wijaranakula, P.M. Burke and L. Forbes, 1986 Materials Research Society pp–693–697.

Epi's Leading Edge, Semiconductor International Jun. 1991 pp.68–71.

Substrate Surface Preparation and Its Effect on Epitaxial Silicon, P. Rai–Choudhury, pp. 1183–1189, 1971.

A Chemical Polish Method For The Preparation Of Silicon Substrates For Epitaxial Deposition Fairhurst and Rich, pp. 15–18 (1966).

Mechanical Thinning Of InP Wafer by Grinding, Nishiguchi et al., pp. 1826–1831 (1991).

U.K. Patent No. 1,126,639 Flat Grinding of Semiconductor Wafers—Report of Dr. Hubert Hinzen.

* cited by examiner

*Primary Examiner*—Savitri Mulpuri
(74) *Attorney, Agent, or Firm*—Harold James; Robert L. Epstein; James & Franklin LLP

(57) ABSTRACT

Transient voltage suppressor semiconductor devices and other semiconductor devices having rigorous requirements for the diffusion and depth of impurities to produce P-N junctions can be fabricated at surprisingly low costs without sacrifice of functional characteristics by subjecting the substrate to a grinding process resulting in a surface short of polishing perfection, thereby to eliminate the time-consuming and hence costly conventional polishing operation, and then diffusing the desired impurity into the substrate from a solid impurity source.

16 Claims, No Drawings

LOW COST METHOD OF FABRICATING TRANSIENT VOLTAGE SUPPRESSOR SEMICONDUCTOR DEVICES OR THE LIKE

The present invention relates to an improved method of fabricating transient voltage suppressor semiconductor devices or the like, which involves abrading the substrate surface before diffusion to a degree short of polishing, followed by diffusion which results in devices functionally the equal to of those more costly devices produced by the conventional polishing operation.

BACKGROUND OF THE INVENTION

Transient voltage suppressor devices are essentially diodes designed to be incorporated into an electrical circuit to protect that circuit against excessive voltage by breaking down and conducting if the voltage applied to them exceeds a predetermined value. Such devices usually constitute two such diodes electrically connected in opposing relation so as to protect against excessive voltage in either direction. The breakdown voltage at which such devices function depends to a large extent on the impurity concentration and depth of diffusion into the substrate. Hence variations in those parameters and particularly depth of diffusion at different points across the surface of the substrate are most undesirable. For that reason it has in the past been thought to be essential, if an effective yield of properly acting devices is to be obtained, that the substrate surfaces must be highly polished, and anything short of that high polish was thought to be commercially excluded. Polishing is an extremely time-consuming process, and when it is considered that bi-directional transient voltage suppressors of the prior art require that both opposing surfaces of the substrate be polished, the economic problems presented by the need for polishing are doubled.

Industry standard steps for obtaining a prior art mirror-like polished surface on a substrate include saw slicing, mechanical lapping, cleaning, edge rounding, caustic etch, another cleaning, followed by a multi-step, chemical and mechanical, polishing, followed by a final cleaning step. The polished surfaces thus produced are very prone to damage by handling or otherwise.

SUMMARY OF THE INVENTION

In accordance with the present invention, in order to produce the desired optimum mirror-like surface on the wafer, but in a fraction of the time previously required for polishing, a non-polishing grinding process is employed of the type disclosed in U.S. Pat. No. 5,360,509 of Nov. 1, 1994 entitled "Low Cost Method of Fabricating Epitaxial Semiconductor Devices" and owned by the assignee of this application. As a result, and as set forth in that patent, while with mechanically polished devices polishing on one side alone alone has taken 1 to 2 hours, by way of contrast the grinding in the present process takes but 2 to 4 minutes per side. The grinding may be followed in the present process by an optional etching step, but that etching step takes only about 2 minutes. Hence the time comparison of the present process as compared to the polishing process for a bi-directional device involves a comparison of at most 10 minutes to 4 hours. The consequent saving in cost of production is obvious.

In the aforementioned U.S. Pat. No. 5,360,509, the grinding process is followed by epitaxial introduction of impurities. That process of impurity introduction is itself relatively costly. Other less costly impurity introduction methods are known, among which is the use of a solid impurity source from which the impurity is diffused into the substrate. However, because of the tightness of the breakdown voltage requirement for devices of the type under discussion and the sensitivity of the breakdown voltage at a given point on the surface of the substrate to the precise depth of the P-N junction at that point, with that depth being a function of the smoothness of the surface into which the impurities is diffused, it had been thought in the past that in order to use solid source diffusion for devices of this type the substrate surfaces exposed to the impurities must be exceedingly highly polished.

We have discovered that by using the non-polishing grinding procedure here described solid source diffusion can be used to produce accurate devices, especially of the bi-directional type, with high production yield and at a very significantly reduced cost.

By way of example, the cost of a cut wafer suitable for products of the type under discussion is about $8 for a 4" wafer. If that wafer is subjected to normal polishing on one side its cost is about $15 and if it is subjected to polishing on both sides its cost is about $30. The roughness of the cut surface, measured from peak-to-valley, is in excess of 5,000 Angstroms, whereas the peak-to-valley roughness of a polished surface is about 20 Angstroms. By way of contrast the peak-to-valley surface roughness produced by the grinding process here described is about 150 Angstroms. The cost of the wafers ground on only one side is about $10 and the cost of that wafer ground on both sides is about $12. The comparison is therefore between $30 and $12 for a 4" wafer ground on both sides, quite a significant saving in wafer costs without any sacrifice in breakdown voltage precision.

It is the prime object of the present invention, therefore, to devise a process for the formation of transient voltage suppressor semiconductors on a substrate which will be less time-consuming and costly than prior art methods but which will produce voltage suppressor devices of at least equal functional quality as compared to devices made by the prior art polishing process.

DETAILS OF THE PREFERRED EMBODIMENT

The first step in the process of the present invention is, as has been indicated, the application of grinding, but not polishing, to produce the desired surface on which to form the diffused layer. That grinding is best carried out at high rotational speeds of the cutting wheels in order to optimize the surface finish that is produced and reduce internal structural stresses. A speed of 4000–4300 rpm has been found to be appropriate. In addition, it has been found to be preferable to carry out the grinding process in two steps while using diamond grinding wheels of different degrees of fineness. In the first step the grinding wheel has a grit of 40–60 micron size to produce a comparatively coarse grinding step, and in the second step the grinding wheel has a 4–6 micron grit to produce a fine grinding step. The coarse grinding is carried out so as to produce a depth reduction of no less than 50 microns, while the fine grinding step is carried out to remove 15–30 or 40 microns. The material removal rate in each step preferably does not exceed one micron per second. The removal rate can be slower, with the removal rate of approximately one-half micron per second being optimum in many situations. During this grinding the surfaces being ground must be lubricated and cooled, and hence an excess of deionized cooling water may be provided, at a rate of at least 4 gallons per minute, with a rate of 8 gallons per minute being preferred. Moreover, it has been found desirable, in order to minimize residual surface damage which might otherwise result from the use of a grinding process, that the grinding wheels both at the end of the coarse grinding step and of the fine grinding step be caused to dwell at a fixed position corresponding to their final positions after the desired amount of material has been removed. The dwell time at the end of the coarse grinding step is at least 10–20 seconds, with 10 seconds being preferred, and the dwell time at the end of the fine grinding step is 20 seconds or more, with 30 seconds being preferred.

For bi-directional devices the grinding process is preferably carried out first on one side of the wafer and then on the other.

After grinding the silicon surface should be kept wet to prevent any residual contaminants from settling on it. Hence the wafer, and preferably a group of ground wafers, may be sprayed with a deionized water mist and then transferred to an ultrasonic cleaner where it is subjected to a surfactant type cleaning for at least 30 minutes.

The surfactant is then rinsed off with deionized water preferably having a resistance of about 18 megohms, after which the final cleaning is a modified industry standard cleaning generally designated megasonic (40°–60° C.) SC1 and SC2. The SC1 clean is preferably formed of one part hydrogen peroxide, one part ammonium hydroxide and 10 parts of water by volume, while the SC2 clean is preferably formed of one part of hydrogen peroxide and one part of hydrogen chloride in 10 parts of water by volume. Each clean may be carried out for 10 minutes.

The wafer may then be provided with a surface etch at 12 to 25° C. to remove any residual scratches and possible remaining contaminants. The etching is preferably an acid etch consisting of one part of hydrofluoric acid, one part of acetic acid and three parts of nitric acid. This etching step is optional.

The wafer is now ready for impurity diffusion from a solid diffusion source. To that end, the wafers are loaded into a quartz boat with the solid impurity sources interspersed between them. To produce a uni-directional device, the boat is designed with two wafer slots between two solid sources, the wafers being loaded into the two slots respectively back-to-back with fronts facing the solid source. For a bi-directional device the boat is designed with one wafer slot in between two solid sources, a wafer being loaded into the wafer slot with each of its fronts facing a solid source. The boats containing wafers and solid sources are then subjected to a heat treatment which causes the impurities to be deposited on the exposed surface of the wafers and then diffused into the bodies of the wafers for a period of time sufficient to produce a depth of diffusion corresponding to the desired breakdown voltage. For low voltage transient voltage suppressor (6.8 volts–10 volts) resistivities of 0.0015–0.004 to 0.006–0.008 ohm-cm., a junction depth of about 10 microns will produce a 6.8 volt breakdown and a junction depth of about 15 microns will produce a 10 volt breakdown in a starting wafer of P-type boron. A range of resistivity for a particular voltage breakdown is given because one can obtain the same breakdown voltage using a low resistivity material but with a longer diffusion time. For example a 6.8 volt breakdown voltage can be produced in a boron-impurity wafer having a resistivity of 0.0015 ohm-cm. by depositing the impurity at 1150° C. for 2 hours and driving the impurity in at 1200° C. for 2.5 hours, whereas the same breakdown voltage can be achieved in a boron-impurity wafer having a resistivity of 0.004 ohm-cm. by depositing at 1150° C. for 2 hours and then driving in at 1200° C. for only 1 hour. The preferred process uses the longer drive time to get a deep junction but not so long that it would cost too much to make.

A typical phosphorous deposition involves inserting the boat loaded with P-type wafers and solid sources into a 700° C. furnace with a nitrogen atmosphere at the rate of 3 inches per minute. After the boat is fully in the furnace the temperature is ramped up to 1150° C. at the rate of 5° per minute while oxygen is added to the nitrogen in amount of 2–5% of the nitrogen. The 1150° C. temperature is maintained for 2 hours, during which the bulk of impurity deposition takes place, and the furnace temperature is then ramped down to 700° C. at the rate of 3° per minute, the oxygen-bearing atmosphere being maintained. Then the boat is removed from the furnace at the rate of 3" per minute while the furnace atmosphere is nitrogen.

The phosphorous glass formed on the wafers is then stripped off by immersing the wafer in a 10:1 hydrofluoric acid solution and the sheet resistance of the wafers is measured to insure that deposition has proceeded properly. In a typical instance that sheet resistance should be between 0.70 and 1.0 ohm/SQ.

The impurity is then driven into the wafer by essentially repeating the deposition process, except that the furnace temperature is increased to 1200° C. and the length of time that the wafers are maintained on the temperature will depend upon the resistivity of the starting substrate being used.

To produce transient voltage suppressors having breakdown voltages of over 10 volts the silicon starting wafer may initially have an N-type impurity such as phosphorous, one such device having a 10 volt breakdown with a resistivity of 0.0075–0.01 ohm-cm. and another such device having a breakdown voltage of 500 volts with a resitivity of 4.5–6.0 ohm-cm. The junction depth after deposition and drive-in of a P-type impurity such as boron will be about 15 microns for the 10 volt unit and 35 microns for the 500 volt unit. A P-type boron substrate with an N-type impurity diffused in can be used for devices having a breakdown voltage up to 90 volts for unidirectional devices and 22 volts for bi-directional devices. The specific procedures for deposition and drive-in for the N-type wafers is essentially the same as that described above for the P-type wafers, except that the deposition time for higher voltages or deeper junction devices would be increased up to 4 hours, the drive temperature would typically be 1250°, and the drive time would be from 1–20 hours depending upon the breakdown voltage.

At the end the surface impurity concentration should be $10^{20}$ atoms/cc or better, and preferably $10^{20\text{-}21}$ atoms/cc. In order to obtain good ohmk contact.

Wafers, when processed as described above and fabricated into discrete devices, produce devices which are equivalent in quality, yield and performance to devices formed on standard polished (chemical-mechanical wafers) either by epitaxial growth or by diffusion from solid sources. However, the manufactured cost of devices made according to the present invention can be as much as 60% less than the manufactured cost of conventional polished wafers with junctions formed either by epitaxial deposition or diffusion.

While only a limited number of embodiments of the present invention have been here disclosed with specificity, it will be apparent that many variations may be made therein all within the scope of the invention as defined in the following claims.

We claim:

1. The method of fabricating transient voltage suppressors and other semiconductor devices involving the diffusion of impurities to produce P-N junctions on a substrate which comprises:
    (1) Subjecting the surface of the substrate adjacent to which a junction is to be formed to a grinding process which removes material from said surface to a depth of at least 65 microns;
    (2) Cleaning said surface without polishing it; and
    (3) Diffusing an impurity into said surface from a solid impurity source positioned adjacent to said surface, thereby to form a P-N junction in said substrate.

2. The method of claim 1, in which, between steps 2 and 3, the substrate surface is subjected to an acid etch to a depth of about 6–10 microns.

3. The method of either of claims 1 or 2, in which step (1) comprises applying the grinding process to both surfaces of said substrate, step (2) is applied to both said surfaces, and step (3) is applied to both said surfaces simultaneously.

4. The method of claim 1 in which said solid impurity source produces a surface concentration of $10^{20}$ or more atoms per cubic centimeter.

5. The method of claim 1 in which said solid impurity source produces a surface concentration between about $10^{20}$ to $10^{21}$ atoms per cubic centimeter.

6. The method of either of claims 1 or 2, in which said grinding process comprises a coarse grinding step in which the grinding element has a grit size of between about 40–60 microns followed by a fine grinding step in which said grinding element has a grit size of about 4–6 microns.

7. The method of claim 6, in which said coarse grinding step removes material from said surface to a depth of at least about 50 microns, and in which said fine grinding step removes material therefrom to a depth of about 15–40 microns.

8. The method of claim 6, in which the rate of material removal during said grinding process is less than about 1 micron per second.

9. The process of claim 6, in which the rotational speed of the grinding elements used in said grinding process is about at least 4,000–4,300 rpm.

10. The process of claim 6, in which, after the grinding element in each of said grinding steps has been advanced to remove the desired amount of material from said surface, the rotated grinding element is caused to dwell at its last grinding position for at least about 10–20 seconds after the coarse grinding step and at least about 10–30 seconds after the fine grinding step.

11. The process of claim 7, in which, after the grinding element in each of said grinding steps has been advanced to remove the desired amount of material from said surface, the rotated grinding element is caused to dwell at its last grinding position for at least about 10–20 seconds after the coarse grinding step and at least about 10–30 seconds after the fine grinding step.

12. The process of claim 8, in which, after the grinding element in each of said grinding steps has been advanced to remove the desired amount of material from said surface, the rotated grinding element is caused to dwell at its last grinding position for at least about 10–20 seconds after the coarse grinding step and at least about 10–30 seconds after the fine grinding step.

13. The process of claim 9, in which, after the grinding element in each of said grinding steps has been advanced to remove the desired amount of material from said surface, the rotated grinding element is caused to dwell at its last grinding position for at least about 10–20 seconds after the coarse grinding step and at least about 10–30 seconds after the fine grinding step.

14. The method of fabricating transient voltage suppressors and other semiconductor devices involving the diffusion of impurities to produce P-N junctions on a substrate which comprises:
    (1) Subjecting the surface of the substrate adjacent to which a junction is to be formed to a coarse grinding step in which the grinding element has a grit size of between about 40–60 microns which removes material from said surface to a depth of at least about 50 microns, followed by a fine grinding step in which said grinding element has a grit size of about 4–6 microns, said fine grinding step removing material to a depth of about 15–40 microns, the rate of material removed during said grinding process being less than about 1 micron per second and the rotational speed of the grinding element used in said grinding process being about at least 4,000–4,100 rpm;
    (2) Cleaning said surface without polishing it with a high purity surfactant followed by a chemical cleaning process comprising the application of a mixture of hydrogen peroxide and ammonium hydroxide in approximately equal parts with about 10 parts of water, followed by a mixture of hydrogen peroxide and hydrochloric acid in approximately equal parts with about 10 parts of water; and
    (3) Diffusing an impurity into said surface from a solid impurity source positioned adjacent to said surface, thereby to form a P-N junction in said substrate.

15. The method of claim 14, in which, after the grinding element in each of the grinding steps has been advanced to remove the desired amount of material from said surface, the grinding element is caused to dwell in its last grinding position for at least about 10–20 seconds after the coarse grinding step and at least about 10–30 seconds after the fine grinding step.

16. The method of claim 14, in which, during said grinding, cooling water is directed onto said surface at the rate of at least 4 gallons per minute.

* * * * *